United States Patent [19]

Sohlbrand

[11] 3,720,542

[45] March 13, 1973

[54] PROCESS FOR PRODUCING DENSE METAL OXIDE COATINGS ON SEMICONDUCTOR

[75] Inventor: Heinrich Sohlbrand, Munich, Germany

[73] Assignee: Siemens Aktiengellschaft, Berlin, Munich and Erlanger, Germany

[22] Filed: March 11, 1971

[21] Appl. No.: 122,988

[30] Foreign Application Priority Data

March 13, 1970 Germany....................P 20 12 080.3

[52] U.S. Cl. ....................117/201, 117/212, 117/5.5

[51] Int. Cl. ..............................................H01l 7/00

[58] Field of Search...............................117/201, 123

[56] References Cited

UNITED STATES PATENTS 3,615,943 10/1971 Genser ................................148/188

FOREIGN PATENTS OR APPLICATIONS 154,125 1963 U.S.S.R. ...............................117/201

*Primary Examiner*—Ralph S. Kendall

*Attorney*—Curt M. Avery et al.

[57] ABSTRACT

The invention relates to a method of producing dense metal oxide coatings on semiconductors surfaces.

To produce metal oxide coatings which serve as insulation or masking layers on a semiconductor body, an organic compound which contains the metal and oxygen, is dissolved in an organic varnish and applied on the semiconductor surface and transferred into the pure metal oxide layer by thermolysis. The invention is particularly suited for producing $Al_2O_3$ layers for integrated circuits and transistors.

2 Claims, 3 Drawing Figures

PROCESS FOR PRODUCING DENSE METAL OXIDE COATINGS ON SEMICONDUCTOR

The present invention relates to a method of producing dense metal oxide coatings which serve as insulation or masking layers, on semiconductor crystal surfaces, particularly for semiconductor components which were produced by the planar method.

To produce the planar structures required for semiconductor components, the surfaces of semiconductor crystals are provided with masking layers, preferably $Si0_2$ or $Si_3N_4$ layers. These masking layers help to limit the indiffusion of doping material into the semiconductor body to those places where said masking layers were removed by the known photoetching methods. Such masking layers also be used for the insulation of contacts, especially during false connections of integrated circuits, via conductor paths, as well as in MOS technology. An insulating layer consisting of $Al_20_3$ is primarily used for this purpose Metal oxide coatings, such as $Si0_2$ and $Al_20_3$ layers on semiconductor crystal surfaces, are usually produced through oxidation of a silicon or aluminum surface, or through thermal dissociation of a reaction gas, comprising a silicon or aluminum compound. Another possibility for producing an $Al_20_3$ layer, for instance, is to oxidize a vapor deposited metallic aluminum layer using an oxygen plasma.

This way of producing a masking or an insulation layer, has the disadvantage that homogenous and dense surface layers are not obtained, without a considerable technical output. The demands placed on such insulating and also masking layers are, first of all, a homogenous, uniform and porefree type of coating, as the quality of the masking layer is responsible for the development of the diffusion zone. A non-homogenously produced masking layer results in underetchings, thereby causing great straying of the electrical magnitudes of the completed components. The insulating layers will have shortcircuits which will result in mechanical defects.

It is an object of the present invention to produce the most uniform and densely fabricated metal oxide coating upon semiconductor crystal surfaces.

To this end and in accordance with the present invention, the surface to be coated with the metal oxide layer is provided with a metal and oxygen containing organic layer dissolved in an organic varnish. The varnish layer is tempered briefly and converted by thermolysis, into a pure metal oxide layer at temperatures above 400°C in a dry inert gas atmosphere.

A further feature of the present invention provides that a photo-sensitive varnish be used, as the organic varnish solution, for producing a structured metal oxide layer. Thereafter the photo method is applied and specific varnish regions are removed. The metal oxide layer is then produced by subjecting the remaining varnish structures, to thermolysis. A thermal after processing of the thus produced structured metal oxide layer may be effected, if necessary, in an inert atmosphere.

Compared to known methods, the method of the invention has the advantage of providing:

1. a more uniform coating as to layer thickness,
2. a pore-free and compact surface coating,
3. a thermally unstable, i.e. heat sensitive surfaces may also be coated with a structured metal oxide masking or insulating layer,
4. a good adhesive strength to the semiconductor surface,
5. a method capable of being carried out with simpler steps which do not entail large technical expenditures.

In place of the photo varnish, the varnish solution may also be nitrocellulose, dissolved in butylacetate/ether and, if necessary, an additional photo method may be used for structuring the metal oxide coating.

The concentration of the compound containing the metal and oxygen is adjusted according to one embodiment, at 15 to 20 percent and the thickness for the applied varnish layer is so selected that, following the tempering process at 100° to 130°C (for 5 minutes), it will amount to about 2 $\mu$m.

Suitable materials for the metal and oxygen containing compound are metal alkoxides, metal salts of simple organic acids and oxygen bridged organic metal complexes whose temperature of dissociation lie between 100° and 250°C. Thus, for example to produce a surface coating consisting of $Al_20_3$, aluminum acetylacetonate, $Al(CH_3COCH = COCH_3)_3$, secondary aluminumbutylate, $Al(OCHCH_3CH_2CH_3)_3$ or aluminum isopropylate $AlCOCH(CH_3)_2)_3$, was applied, and to produce a layer consisting of $SiO_2$, silicon ethylate $Si(OCH_2CH_3)$ or silicontetraacetate $(CH_3COO)_4$—Si in nitrocellulose, dissolved in butylacetate/ether was applied and thermally dissociated at 400° t0 500°C.

The following explains an embodiment example with reference to FIGS. 1 to 3, showing further details of the invention, wherein.

Figure 1:
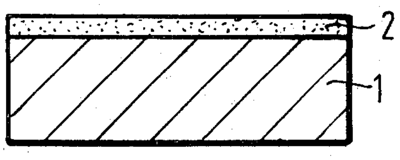
FIG. 1 shows the application of the varnish layer which contains the metal oxygen compound.

On a substrate 1 of FIG. 1, comprising a silicon semiconductor body, a photo-sensitive varnish 2 which contains a dissolved organic silicon or aluminum compound, was applied in the absence of daylight. This compound may consist of aluminumacetylacetonate and be dissolved up to 15 – 20 percent in the varnish. The application was effected by spraying or dipping and by centrifuging. This varnish layer was tempered for 5 minutes at 100° to 130°C and the varnish layer 2 now had a layer thickness of about 5 $\mu$m.

Figure 2:
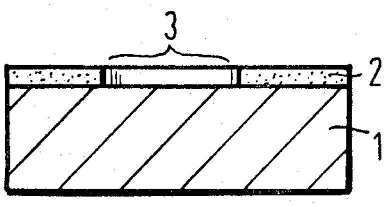
FIG. 2 shows the arrangement following the application of the photo method.
Figure 3:
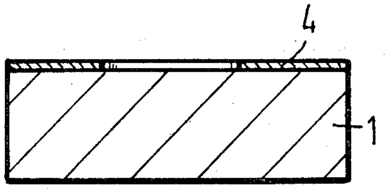
FIG. 3 shows the arrangement following thermolysis.

Then, as shown in FIG. 2, the varnish layer 2 was structured through illumination and development according to a prescribed pattern whereby a diffusion window forms in region 3 of the surface of the silicon substrate 1. To convert the remaining photo varnish structure, which contains the aluminum-acetylacetonate into the desired $Al_2O_3$ layer, the device was then subjected to thermolysis in an oxygen-argon current, at 400° to 500°C, for a period of 10 minutes to yield the $Al_20_3$ layer indicated 4 in FIG. 3, that develops on the silicon substrate 1 in a layer thickness of 0.8 $\mu$m.

This $Al_20_3$ layer can be further densified by an additional method step. This was effected by a second tempering process, in a damp argon atmosphere, at approximately 300°C.

The thus obtained, very dense and homogenous metal oxide layers are particularly suitable for the production of semiconductor components such as silicon planar transistors, integrated semiconductor circuits and MOS transistors.

Another field of usage for the method according to the invention is particularly the production of aluminum oxide layers during the production of thin film circuits, wherein resistors and capacitors are interconnected in multiple circuits.

I claim:

1. Process for producing dense metal oxide coatings which serve as insulating or masking coatings on semiconductor crystals which comprises coating the surface of the semiconductor, which is desired to be coated, with a metal and oxide containing organic varnish, briefly tempering the varnish layer and converting the tempered varnish layer by thermolysis, at a temperature above 400°C in a dry inert gas atmosphere, into a pure metal oxide layer, and wherein aluminumacetylacetonate, secondary aluminumbutylate or aluminumisopropylate in a varnish consisting of nitrocellulose dissolved in butylacetate/ether or of a photosensitive varnish is used and thermolysis at 250°C results in a pure $Al_2O_3$ layer.

2. Process for producing dense metal oxide coatings which serve as insulating or masking coatings on semiconductor crystals which comprises coating the surface of the semiconductor, which is desired to be coated, with a metal and oxide containing organic varnish, briefly tempering the varnish layer and converting the tempered varnish layer by thermolysis, at a temperature above 400°C in a dry inert gas atmosphere, into a pure metal oxide layer, and wherein silicon ethylate or silicon tetraacetate in a varnish consisting of nitrocellulose dissolved in butylacetate/ether or of a photosensitive varnish is used and thermolysis at 400°C to 500°C results in a pure $SiO_2$ layer.

* * * * *